(12) United States Patent
Burton

(10) Patent No.: US 7,405,109 B2
(45) Date of Patent: Jul. 29, 2008

(54) METHOD OF FABRICATING THE ROUTING OF ELECTRICAL SIGNALS

(75) Inventor: William S Burton, Fort Collins, CO (US)

(73) Assignee: Avago Technologies General IP Pte Ltd, Singapore (SG)

( * ) Notice: Subject to any disclaimer, the term of this patent is extended or adjusted under 35 U.S.C. 154(b) by 726 days.

(21) Appl. No.: 11/011,442

(22) Filed: Dec. 14, 2004

(65) Prior Publication Data

US 2005/0103523 A1 May 19, 2005

Related U.S. Application Data

(62) Division of application No. 10/060,536, filed on Jan. 30, 2002, now Pat. No. 6,900,533.

(51) Int. Cl.
*H01L 21/00* (2006.01)
*H01L 23/04* (2006.01)

(52) U.S. Cl. ....................... 438/125; 438/612; 257/773; 257/784; 257/E23.145

(58) Field of Classification Search ................. None
See application file for complete search history.

(56) References Cited

U.S. PATENT DOCUMENTS

| 5,576,519 | A | * | 11/1996 | Swamy ........................ 174/265 |
| 6,163,957 | A | * | 12/2000 | Jiang et al. .................... 29/852 |
| 6,275,358 | B1 | * | 8/2001 | Balakrishnan et al. ... 360/264.2 |
| 6,521,845 | B1 | * | 2/2003 | Barrow ........................ 174/260 |
| 6,632,343 | B1 | * | 10/2003 | Farnworth et al. .......... 205/125 |
| 6,740,978 | B2 | * | 5/2004 | Huang et al. ................. 257/773 |
| 6,800,944 | B2 | * | 10/2004 | Buschbom ................... 257/778 |

* cited by examiner

*Primary Examiner*—Alonzo Chambliss

(57) ABSTRACT

A method for manufacturing a layered structure for routing electrical signals comprising the steps of providing a layout for the layered structure having an insulating layer with at least one signal trace, a via, and a stub trace on a first side of the insulating layer, and a generally planar electrically conductive layer disposed on a second side of the insulating layer. Identify the stub trace and define a beneficial portion on the second side based upon a layout of the stub trace where the electrically conductive layer on the second side is to be absent. Modify the layout according to the step of defining and manufacture the layered structure according to the modified layout.

7 Claims, 10 Drawing Sheets

METHOD OF FABRICATING THE ROUTING OF ELECTRICAL SIGNALS

This is a Divisional of application Ser. No. 10/060,536, filed on now U.S. Pat. No. 6,900,533, the entire disclosure of which is incorporated herein by reference.

BACKGROUND

Creation of certain integrated circuit packages and printed circuit boards often uses an electro-plating manufacturing process. One physical artifact of the electroplating process is one or more stub traces that electrically connect a signal via to a perimeter of the package. In view of the sensitivity of some of the signaling frequencies, some integrated circuit packages are designed to connect to controlled impedance transmission lines. At frequencies above 500 MHz, the stub trace presents a transmission impedance mismatch that affects signal integrity. The adverse impact of the resulting signal degradation increases with the signal frequency.

As a signal travels down a signal trace and encounters a via in parallel with the stub trace, the signal splits with a first portion traveling along the via and a second portion traveling along the stub trace. As the second portion of the signal encounters an end of the stub trace, it is reflected. The reflected signal then mixes with the original signal at the via, and causes signal degradation. A relatively short stub trace will reflect the second signal and cause signal degradation early on in a signal transition. This may not present as much a problem if signal registration is later on in the signal transition and after the area in the signal that mixes with the reflection. Longer stub traces, therefore, present more of a problem because reflected signals are more likely to disturb the signal at the via at a time when another component of the system registers the signal.

One available solution to the foregoing problem in the art is the use of an electroless plating or printing process. Printed circuit boards that use a printing process do not have the stub trace artifacts. IC packages, however, are typically manufactured using either the electroplating process or the electroless plating process. The electroless plating process does not create stub traces as an artifact of manufacturing, and therefore, does not present the same issue. Unfortunately, the electroless plating process has higher variability in conductor geometry making it difficult if not impossible to carefully control signal trace impedance. For high frequency signal traces, however, the uniformity of conductor geometry is an important factor in maintaining signal quality. Accordingly, the benefit of the absence of stub traces is somewhat offset by the variability in signal trace geometry. The electro-less plating process, therefore, only partially addresses the issue of obtaining high frequency signal quality. In addition, not all IC package styles are available in the electroless plating process. Accordingly, the electroless plating process may not be available or advisable in certain IC package applications.

Another solution is to arrange the IC die so that all of the contacts carrying high-speed signals are placed on a perimeter of the die where the stub traces are shortest. It saves costs, however, to manufacture small ICs with high density and higher density ICs dictate that interior contacts also carry the high-speed signals.

There remains a need, therefore, to address the deleterious affects of the stub traces that are an artifact of the electroplating manufacturing process.

SUMMARY

An apparatus for routing electrical signals comprises a layered structure with at least one signal trace disposed on a first side of an electrically insulating layer and a via electrically connected to the signal trace. The via has a conductive stub trace electrically connected to it and a generally planar electrically conductive layer disposed on a second side of the electrically insulating layer. The stub trace on the first side defines an area on the second side where the electrically conductive layer is absent.

According to another aspect of the present invention, a method for manufacturing a layered structure for routing electrical signals comprises the steps of providing a layout for the layered structure having an insulating layer with at least one signal trace, a via, and a stub trace on a first side of the insulating layer, and a generally planar electrically conductive layer disposed on a second side of the insulating layer. The stub trace or traces are identified and then a beneficial portion on the second side is defined based upon a layout of the stub trace(s) where the electrically conductive layer on the second side is to be absent. The steps of the method continue with the step of modifying the layout according to the step of defining, and then manufacturing the layered structure according to the modified layout.

Advantageously, use of the teachings of the present invention increase the stub trace impedance thereby reducing the adverse affects of the stub traces on the quality of high frequency response signals.

DETAILED DESCRIPTION

Figure 1:
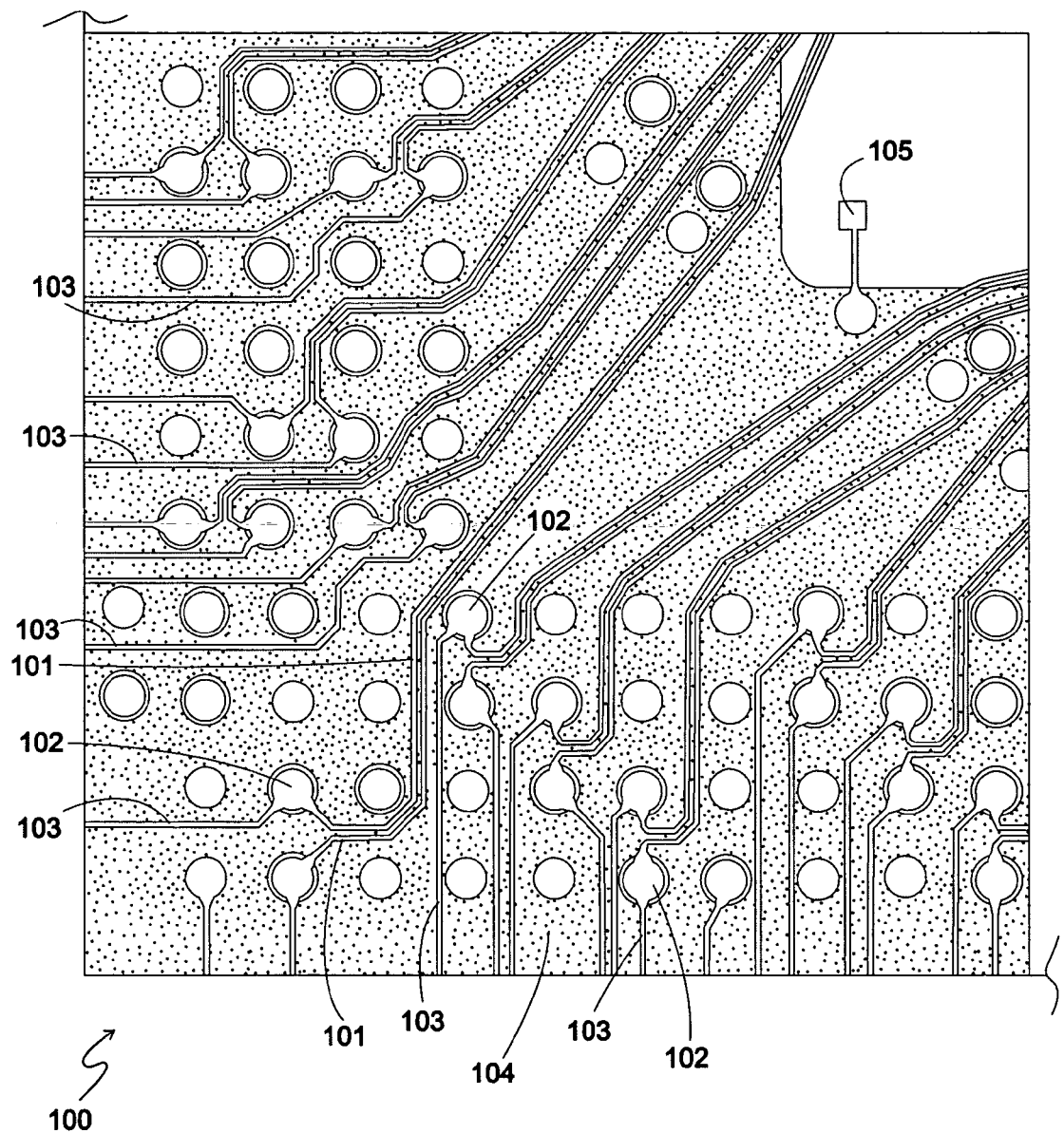
FIG. 1 is a corner section of an IC package according to the prior art and illustrating the existence of stub traces attached to signal vias.

With specific reference to FIG. 1 of the drawings, there is shown a diagram representing a corner of an IC package 100 which is a layered structure having a plurality of signal traces 101 and stub traces 103 on a signal layer, conductive vias 102 that extend through multiple layers, at least one reference layer 104, and insulating layers between the signal and reference layers. For purposes of illustration, the reference layer 104 is shown superimposed upon the signal layer with a dotted cross-hatching. The insulating layer between the signal layer and the reference layer 104 is not shown. The existence of the stub traces 103 indicates that the IC package shown was manufactured using an electro-plating manufacturing process. The IC package 100 has wire-bond pads 105 that connect one of the plurality of signal traces 101 and vias 102 to a contact on an IC die (not shown) for routing an electrical signal from the IC die to the vias 102 on the IC package 100. In the illustration shown in FIG. 1 of the drawings, the wire-bond pads 105 that connect to the signal traces 101 and vias 102 are not shown in the view of just the corner of the IC package 100. Each via 102 is electrically connected to conventional interconnection balls (not shown) or other conventional interconnection vehicle on the IC package 100 that may be used for attachment of the IC package 100 to a printed circuit board ("PCB"). There are multiple wire bond pads that connect multiple signal traces to various points on the IC die. Each one of the multiple signal traces is routed to a different via 102 and interconnection ball of the IC package. The interconnection balls of the IC package 100 are used to further integrate the packaged IC into a larger circuit on the PCB.

Figure 2:
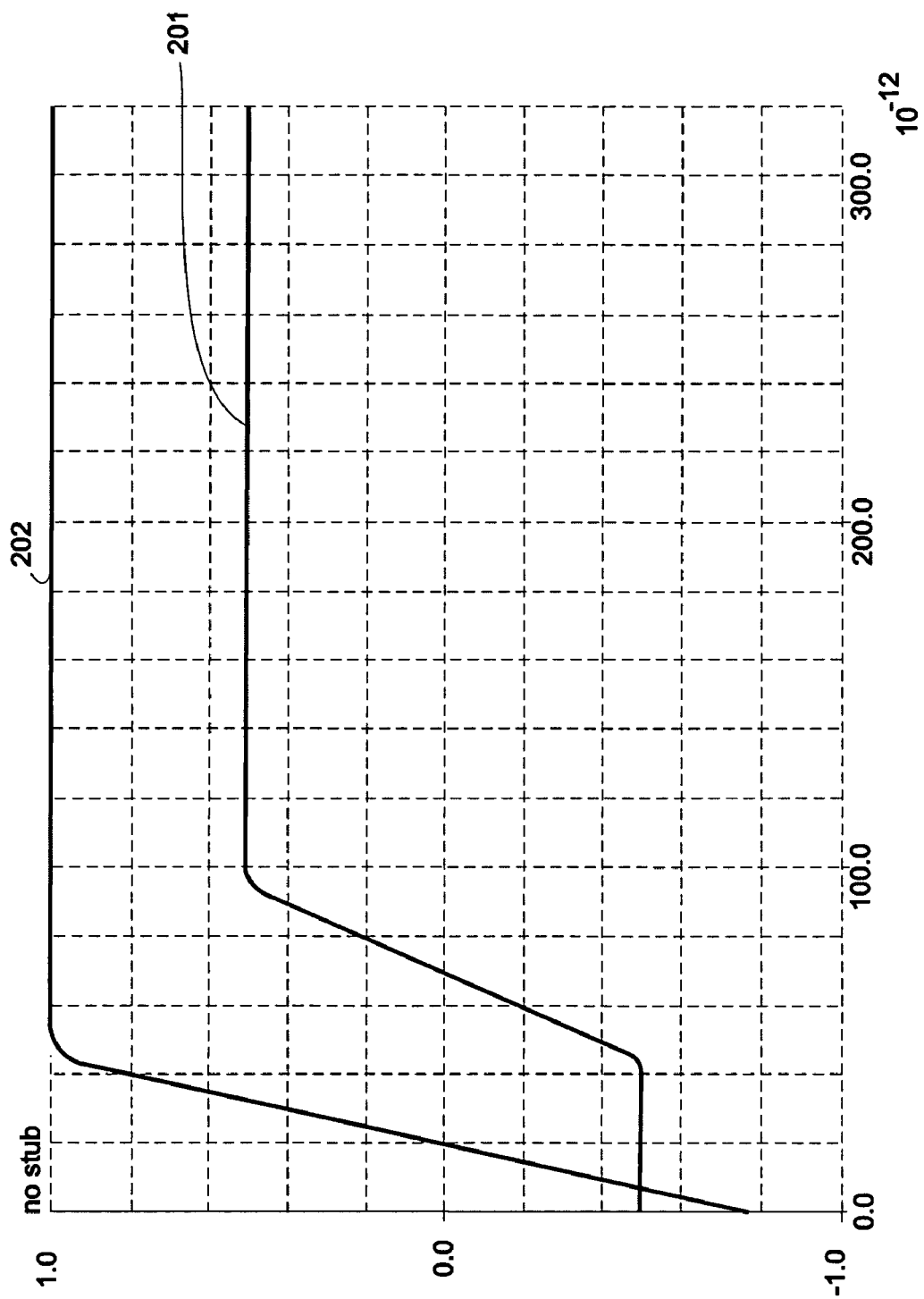
FIG. 2 is a graph of an idealized response signal at a via without a stub trace.

With specific reference to FIG. 2 of the drawings, there is shown a graph illustrating an idealized response signal 201 as seen at the via 102 in response to a stimulus signal 202 at wirebond pads 105 in the absence of the stub trace 103 electrically connected to the respective via 102. In this example, the signal trace 101 and via 102 are designed to match to a 50 ohm impedance transmission line, the impedance match is nearly perfect and the idealized response signal 201 has a smooth transition without overshoot, ringing or undershoot. The delay of the response signal 201 from the stimulus signal 202 is associated with the time it takes the stimulus signal 202 to traverse the signal trace 101. The reduction in amplitude of the response signal 201 relative to the stimulus signal 202 is a result of a matching 50 ohm signal source series resistance in the model that simulates the signals. The closer the IC package and signal trace design is to the 50 ohm impedance, the better the signal profile transfer from the pads 105 to the via 102.

Figure 3:
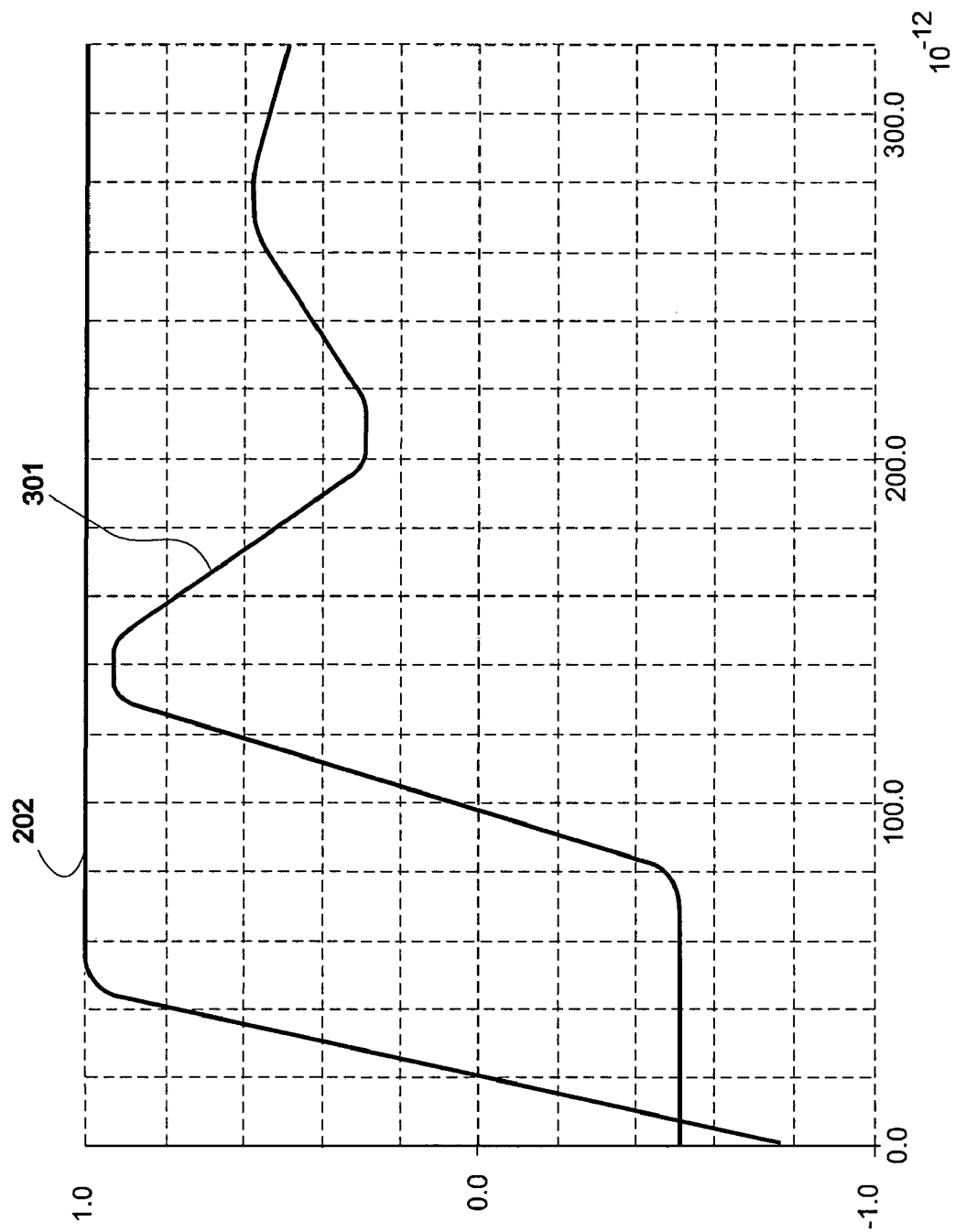
FIG. 3 is a graph of a simulated response signal at a via in the presence of a stub trace.

With specific reference to FIG. 3 of the drawings, there is shown a simulated response signal 301 to the stimulus signal 202 in a prior art embodiment of an IC package in the presence of the stub trace 103. The simulated response signal 301 exhibits overshoot, ringing, and delay.

Figure 4:
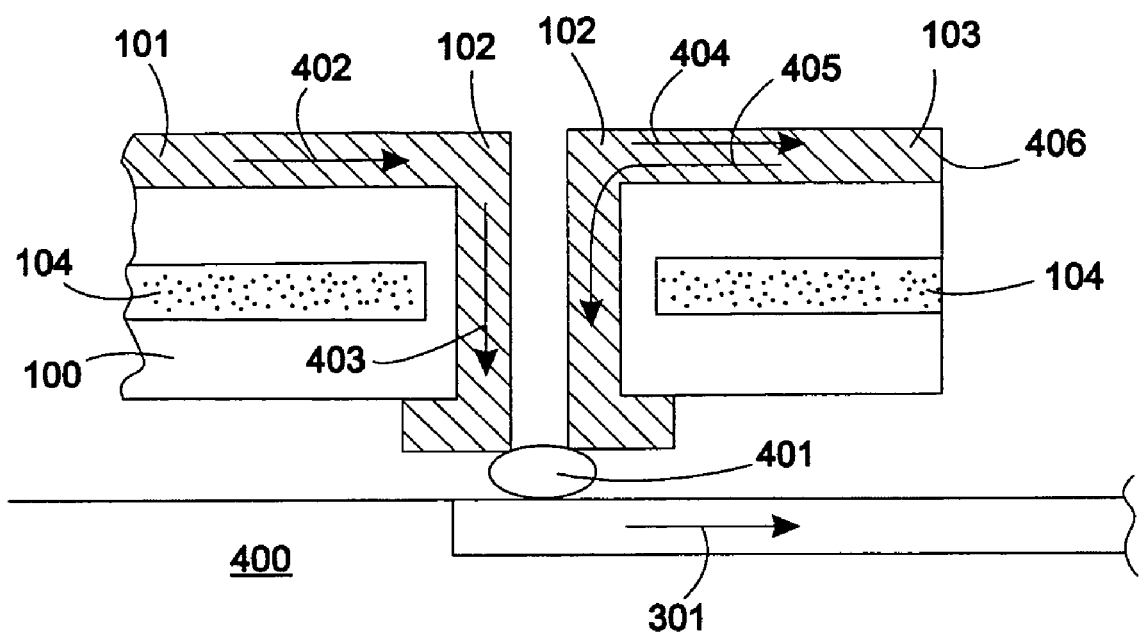
FIG. 4 is cross sectional illustration of a signal trace, via, and stub trace.

It has been found that the source of much of the signal degradation is due to the stub trace 103. With specific reference to FIG. 4 of the drawings, there is shown a cross sectional representation of a signal trace 101, via 102, stub trace 103 connected to a PCB 400 through an interconnection ball 401. Because the stub trace 103 is electrically connected to the via 102, a high frequency primary signal 402 travels down the signal trace 101 and encounters a 50 ohm impedance, the impedance to which the PCB connection is designed, in parallel with a stub trace impedance. Because the impedance of the stub trace 103 is typically close in value to the impedance of the signal trace 101 and via 102 as attached to the PCB, the parallel combination presents an effective splitter at the via 102 which is the junction of the two impedances. As a result of the splitter, a first portion of the primary signal 403 is launched onto the via 102 as desired and a second portion, herein referred to as "an errant signal" 404, is launched onto the stub trace 103. As one of ordinary skill in the art can appreciate, if the stub trace impedance is similar in magnitude to the impedance of the electrical path to the PCB, a relatively large percentage of energy in the primary signal 402, for example almost half, is diverted as the errant signal 404 onto the stub trace 103 thereby attenuating the primary signal 402 by the amount of energy in the errant signal 404. As the errant signal 404 travels down the stub trace 103, it encounters the edge 406 of the IC package 100, which appears as a very high impedance load or open circuit. Upon reaching the high impedance load, virtually all of the errant signal 404 is reflected and travels back down the stub trace 103 as a reflected errant signal 405 to the via 102 from which it was launched. At the via 102, the reflected errant signal 405 mixes with the first portion of the primary signal 403 to generate a highly degraded actual response signal 301. With specific reference to FIG. 5 of the drawings, there is shown a corner of an IC package 100 according to the teachings of the present invention in which a portion of the reference layer 104 is removed from around the stub traces 103. Consider that the source of the signal degradation identified in FIG. 3 is the existence of the stub traces 103. Consider also that the two primary factors affecting the characteristics of the signal degradation are stub trace length and the stub trace impedance. Because the stub trace length is controlled by and large by the position of the signal vias 102 relative to the edge 406 of the IC package 100, the greatest amount of control over the signal degradation is control over the impedance of the stub traces 103. The teachings of the present invention propose to modify the IC package 100 to increase the stub trace impedance while maintaining the signal trace impedance and structural integrity of the IC package 100. An increase in the stub trace impedance performs two functions. An increase in the stub trace impedance causes the errant signal 404 to be a lesser percentage of the primary signal 402 when it is split at the via 102. The errant signal 404 is then attenuated more aggressively than in the prior art as it travels down the stub trace 103 before it reaches the open circuit at the edge 406 of the IC package 100 and then the reflected errant signal 405 is further attenuated as it travels back toward the via 102. As one of ordinary skill in the art appreciates, therefore, the. reflected errant signal 405 that then mixes with the first portion of the primary signal 403 has less energy relatively speaking, thereby making less of an adverse impact on the resulting response signal 301 and improving overall signal quality.

Figure 5:
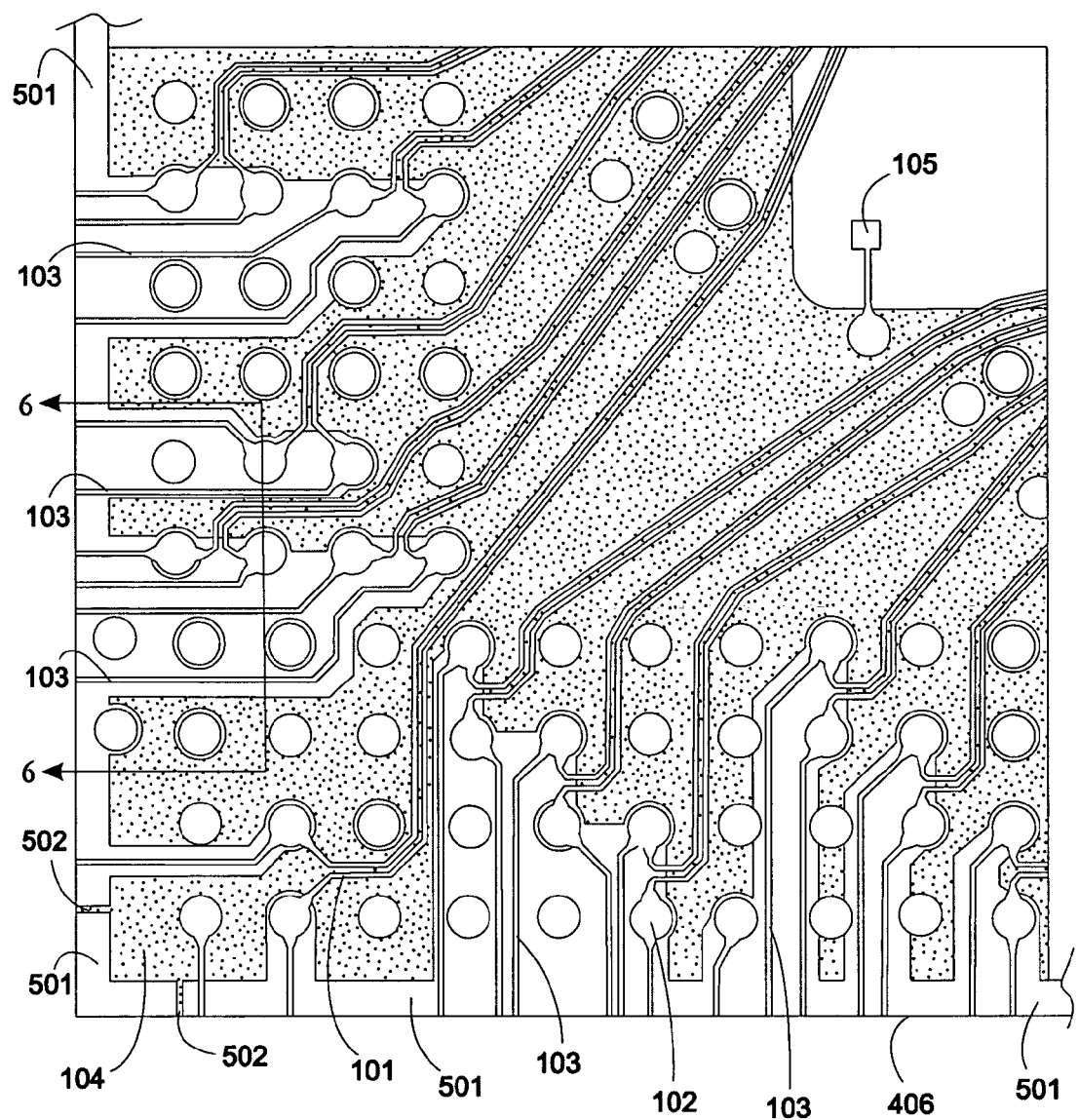
FIG. 5 is a corner section of an IC package according to teachings of the present invention.

One modification made to the prior art that increases stub trace impedance is to remove the portion of the reference layer 104 directly adjacent the stub traces 103 without disturbing the reference layer 104 adjacent the signal traces 101. FIG. 5 of the drawings shows certain portions removed from the reference layer 104 as defined by the position of the stub traces 103 electrically connected to those vias 102 positioned in a via row away from the edge 406 of the IC package 100. In the embodiment illustrated in FIG. 5, the reference layer 104 under all of the stub traces 103 that electrically connected to vias 102 that are also electrically connected to signal traces 101 is modified. Alternatively, only the relatively longer stub traces 103 may be modified if they were deemed to either have an insufficient impact on signal quality or have an insufficient impact on the registration of the signal to warrant the modification. A "long" stub trace is one where the delay between the launch and the receipt at the via 102 of the reflected errant signal is equal to or greater than the rise time of the stimulus signal. Embodiments designed for higher signaling frequencies benefit from the increased stub trace impedance for the shorter stub traces as well as the longer ones.

Figure 6:
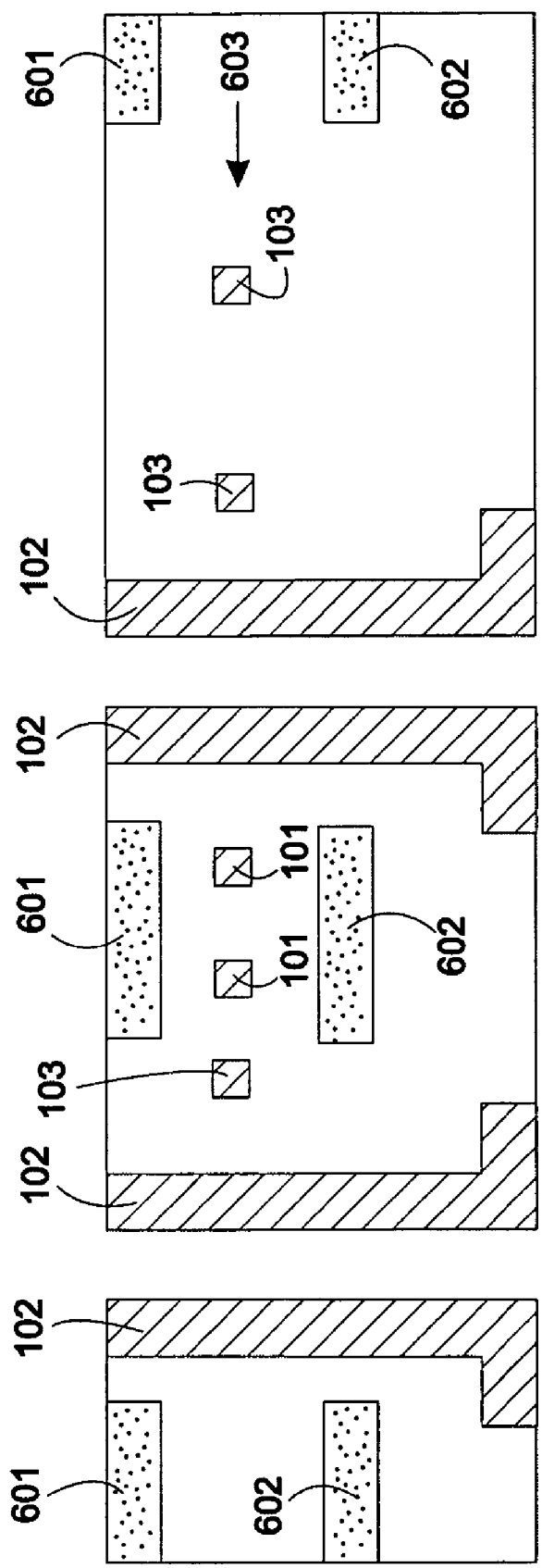
FIG. 6 is a sectional view of a portion of the IC package shown in FIG. 5 and taken along sectional lines 6-6.

The illustration of FIG. 5 shows a microstrip implementation where there is a single signal reference layer 104 for the signal traces 101. With specific reference to FIG. 6 of the drawings, there is shown a cross section of portion of the IC package 100 shown in FIG. 5 of the drawings and taken along the sectional lines 6-6 having a strip-line implementation according to the teachings of the present invention. The teachings herein are equally applicable to the strip-line implementation where there are first and second reference layers 601, 602 on opposite sides of the signal layer 603. A plan view of the strip-line implementation is similar to the plan view of the microstrip implementation as shown in FIG. 5 of the drawings because the first and second reference layers 601, 602 have identical portions that are absent in order to increase the impedance of the stub traces 103. The first reference layer 601 in a plan view representation, therefore, obscures the second reference layer 602. The signal layer 603 contains both signal traces 101 and stub traces 103, the only difference between the two types of traces being their function on the IC package 100. The signal traces 101 have portions of the first and second reference layers 601 and 602 that are adjacent the signal traces 101 in tact, while the stub traces 103 have an absence of portions of the first and second reference layers 601 and 602 that are adjacent to the stub traces 103.

Figure 7:
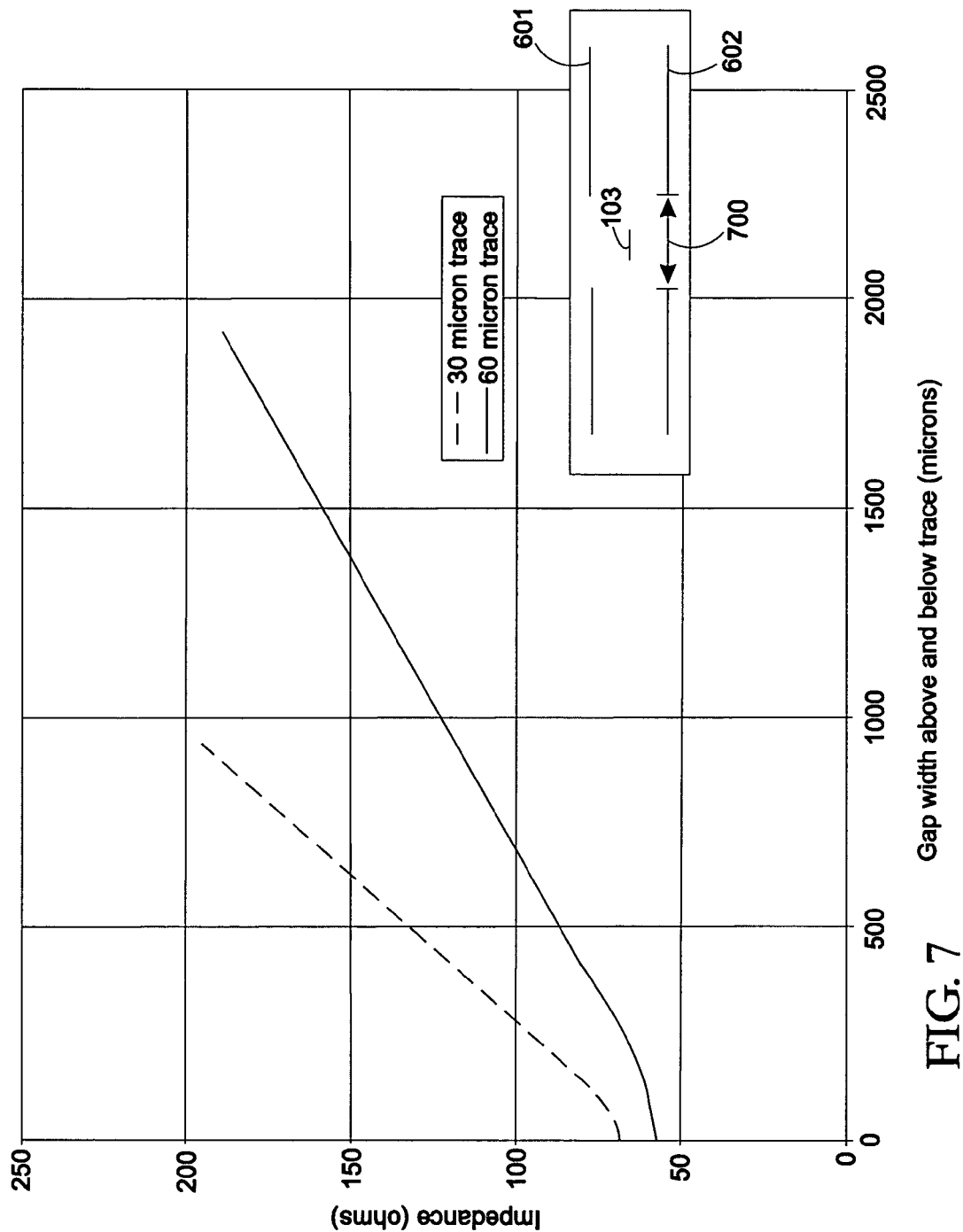
FIG. 7 is a graph showing a relationship of trace geometry to impedance that is used to inform an aspect of the present invention.

With specific reference to FIG. 7 of the drawings, there is shown a graph that represents a relationship between the increase in impedance of the stub trace 103 relative to a width of a gap 700 in the reference layers 601, 602 for a strip-line implementation. Materials and dimensions used to generated FIG. 7 of the drawings are typical for 50 ohm integrated circuit packages, and can be adapted for differing impedance designs by one of ordinary skill in the art. The specific magnitude of the impedance increase varies in differing impedance designs depending upon the width of the stub trace 103, but the generally linear relationship between impedance and width of the gap 700 in the reference layers 601, 602 is similar. A microstrip implementation has a similar quasi-linear relationship between gap width in the reference layer 104 and impedance, but has varying parameters than what is shown in FIG. 7. Other parameters such as dielectric constant, spacing between the stub trace 103 and the reference layers 601 and 602 or reference layer 104, and trace material also affect actual impedance values. The basic point is that there is a quasi-linear relationship that may be used to help inform the specifics of the teachings of the present invention. Using the graph and the mathematical relationship between gap width 700 and stub trace impedance for a given IC package design, it is possible to mathematically identify the size of the desired increase in impedance and to then quantify the necessary width of the gap 700 in the reference layer 104 or reference layers 601, 602 to achieve the desired impedance increase. The gap in the reference layer 104 or reference layers 601, 602 adjacent the stub trace 103 is centered on the stub trace 103 and extends a distance greater than the width of the stub trace 103 to achieve a maximum impedance increase. In the case where a signal trace 101 is very close to the stub trace 103, it may not be possible to place a sufficient gap in the reference layer 104 or layers 601, 602 without compromising the impedance of the signal trace 101. In that case, the signal trace 101 impedance consistency is preferred over the increase in stub trace impedance and the reference layer should extend to completely cover the portion adjacent to the signal trace 101.

Another modification to increase stub trace impedance that may be made either independently or in conjunction with placement of the gap 700 in the reference layer 104 or reference layers 601, 602 adjacent the stub traces 103 is to minimize a width of the stub trace 103 itself. In the case where the trace width of both signal and stub traces 101, 103 is not at a minimum, it is beneficial to reduce the stub trace width to the smallest width that is able to accomplish the electroplating process. As one of ordinary skill in the art appreciates, a smaller stub trace 103 width relative to the signal trace 101 width, increases the relative impedance of the stub trace 103 as compared with the transmission impedance at the via 102 and provides for a lower energy errant signal 404. Additionally, the errant signal 404 is more aggressively attenuated as it travels, reflects, and then travels back to the via 102 where it mixes with the first portion of the signal 403.

With specific reference to FIG. 5 of the drawings, another aspect to an embodiment of the teachings of the present invention increases the impedance of all of the stub traces by removing a perimetrical portion 501 of the reference layer 104 of the IC package 100 in a microstrip embodiment or removing the same perimetrical portion in the reference layers 601 and 602 in the strip-line implementation. The practical limit of how thick the perimetrical portion 501 may be is a manufacturing constraint based upon minimizing variations in substrate thickness For purposes of properly supporting the electroplating manufacturing process, a plurality of reference layer access lines 502 electrically connect a perimeter edge 406 of the IC package 100 to the reference layer 104 or layers 601, 602. In the embodiment illustrated in FIG. 5, all of the stub traces 103 have an area of increased impedance above the perimetrical portion 501.

Figure 8:
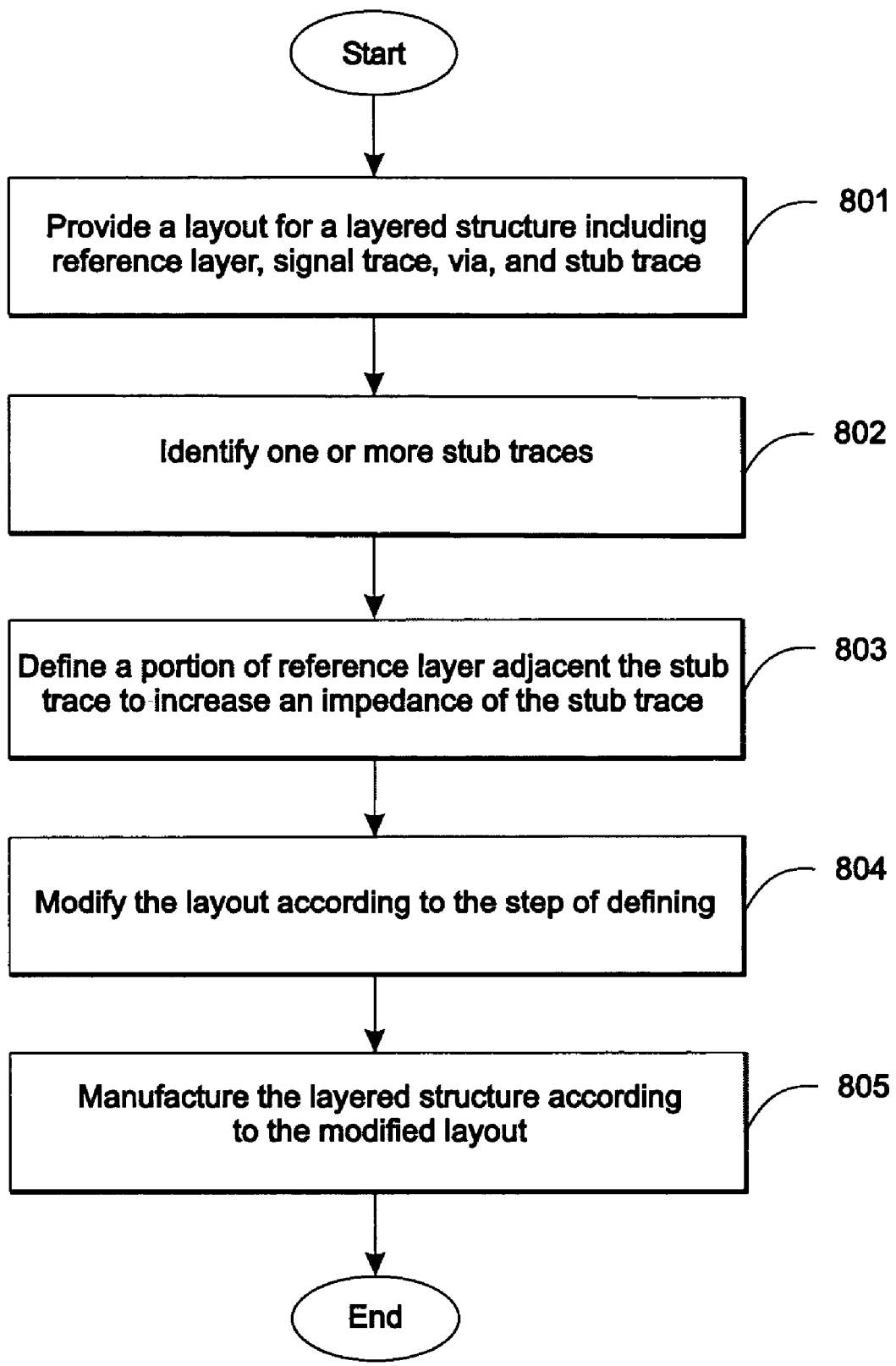
FIG. 8 is a flow chart of an embodiment of a method according to the teachings of the present invention.

With specific reference to FIG. 8 of the drawings, there is shown a flow chart of steps in a method for manufacturing an improved layered structure according to the teachings of the preset invention. The method calls for providing a layout 801 for a layered structure including a signal trace 101 and at least one reference layer 104 or layers 601 and 602 for the signal trace 101, and a via 102 and a stub trace 103 electrically connected to the signal trace 101. One or more of the stub traces 103 are identified 802 as possible causes of signal degradation. The method then calls for defining 803 a portion of the reference layer 104 or layers 601 and 602 adjacent the stub trace 103, the removal of which will beneficially increase the stub trace impedance. The layout is then modified 804 according to the step of defining and the layered structure is manufactured 805 according to the modified layout. As a practical matter, there may be more than one layer than includes signal traces 101 and stub traces 103. In that case, there will also be additional reference layers (not shown) used by the additional signal layer that may also be modified according to the teachings of the present invention as defined by the stub traces contained in the additional layer(s).

Figure 9:
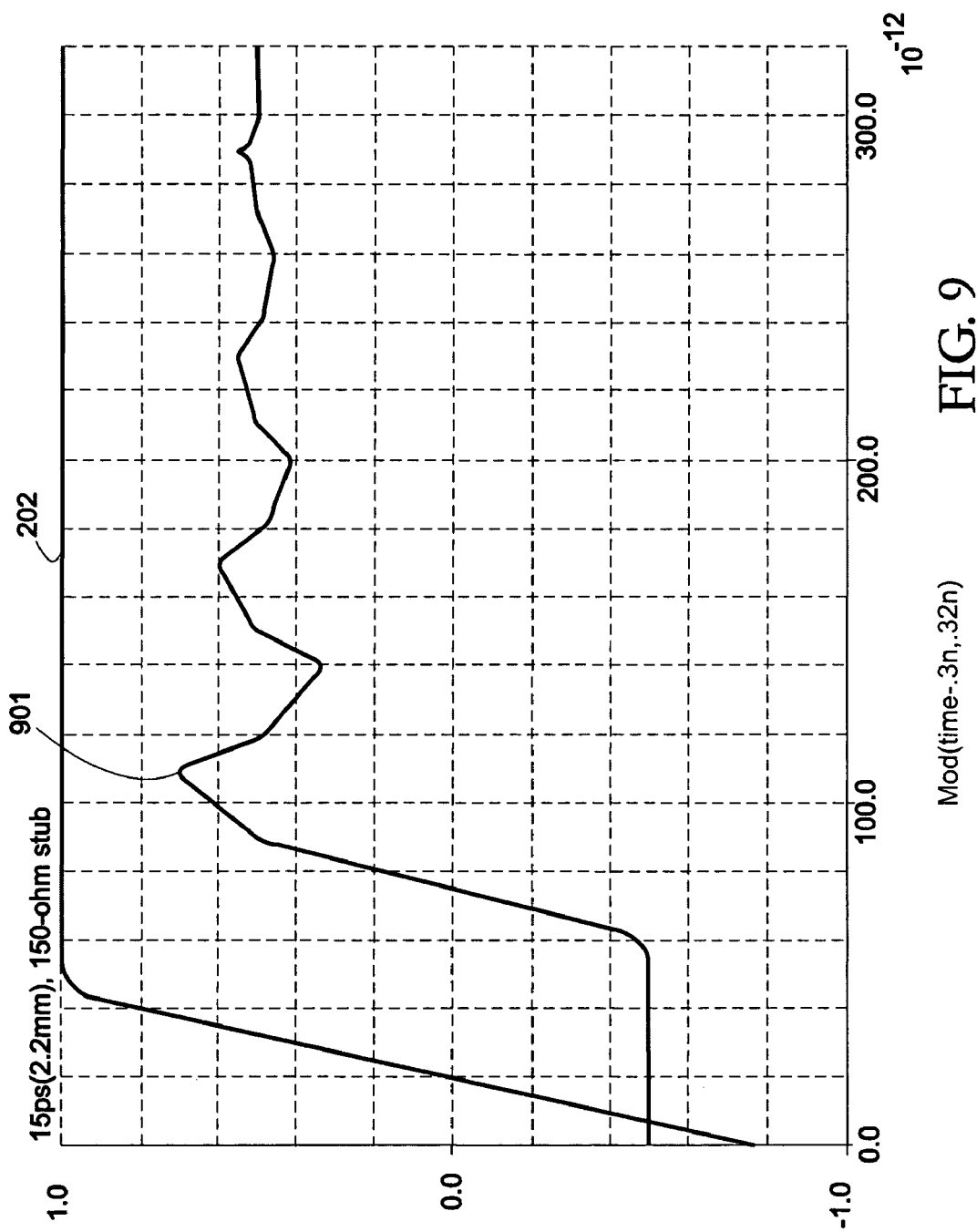
FIG. 9 is a graph of a simulated signal at a via in the presence of stub traces and with benefit of the teachings of the present invention.
Figure 10:
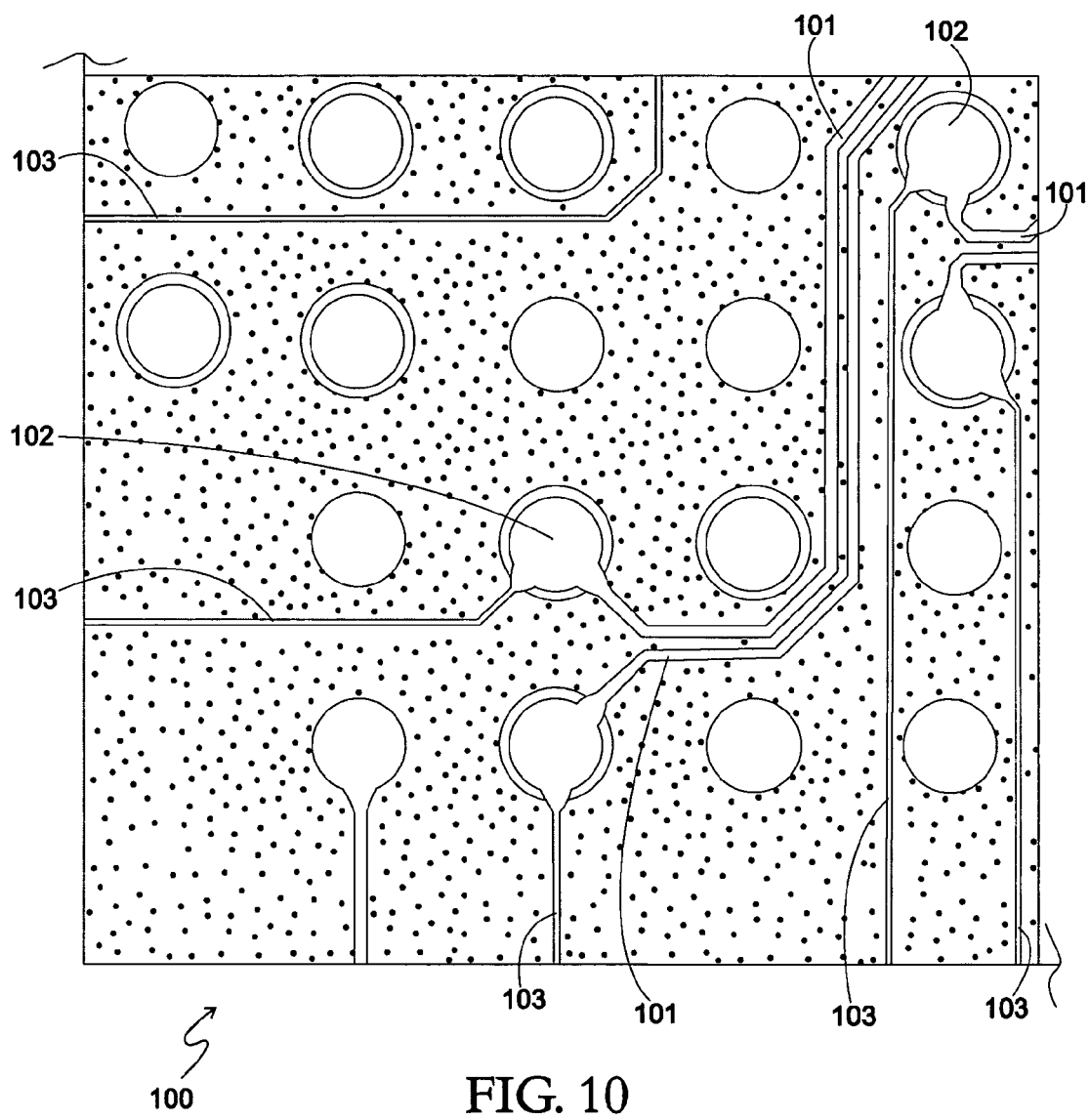

With specific reference to FIG. 9 of the drawings, there is shown a graph illustrating asimulated response signal 901 to the stimulus signal 202 in an embodiment of an IC package 100 according to the teachings of the present invention. The graph shows that the simulated response signal 901 exhibits less overshoot, ringing, and delay when compared to the same simulated response signal 301 in the prior art embodiment shown in FIG. 3.

Embodiments of the invention are shown by way of example to fully describe the teachings of the present invention. As such, the drawings are meant to be illustrative and limitive of that which is claimed. Alternate embodiments not specificially disclosed herein will also occur to those of ordinary skill in the art with benefit of the present teachings. Other embodiments include without limitation, microstrip and stripline embodiments including any number of layers of signal and reference layers. The teachings of the present invention are also appropriate for any via density. The greater the number of vias that are close to an internal portion of the IC die and therefore have longer stub traces attached thereto, the greater the relative advantage to use of the teachings of the present invention.

The invention claimed is:

1. A method for manufacturing a layered structure for routing electrical signals comprising the steps of:
   providing a layout for the layered structure having an insulating layer with at least one signal trace, a via, and a stub trace on a first side of said insulating layer, and a generally planar electrically conductive layer disposed on a second side of said insulating layer, identifying said stub trace, defining a beneficial portion on said second side based upon a layout of said stub trace where said electrically conductive layer on said second side is to be absent, modifying said layout according to said step of defining, and manufacturing said layered structure according to said modified layout.

2. A method for manufacturing a layered structure as recited in claim 1 wherein said layered structure has a plurality of said signal traces, said vias, and said stub traces on said first side of said insulating layer and said step of identifying comprises identifying one or more of said stub traces, and said step of defining further comprises defining said beneficial portion for each one of said one or more stub traces.

3. A method for manufacturing a layered structure as recited in claim 2 wherein said step of identifying comprises locating one or more stub traces that are relatively longer than remaining ones of said stub traces.

4. A method for manufacturing a layered structure as recited in claim 1 and further comprising the step of simulating performance of a signal on a signal trace, said signal having a registration window wherein said step of identifying comprises locating one or more stub traces that are predicted to generate reflections on said signal traces to which they attach that are added to a signal on said signal trace at a time during said registration window.

5. A method for manufacturing a layered structure as recited in claim 1 wherein said beneficial portion is defined by more than one stub trace.

6. A method for manufacturing a layered structure as recited in claim 1 wherein said layered structure is an integrated circuit package.

7. A method for manufacturing a layered structure as recited in claim 1 wherein said layered structure is a printed circuit board.

* * * * *